(12) United States Patent
Biswas et al.

(10) Patent No.: US 9,684,746 B2
(45) Date of Patent: Jun. 20, 2017

(54) SIGNAL RECONSTRUCTION IN SEQUENTIAL LOGIC CIRCUITRY

(71) Applicant: Synopsys, Inc., Mountain View, CA (US)

(72) Inventors: Parijat Biswas, Karnataka (IN); Shyam Datta, Fremont, CA (US); Subhrajyoti Chakraborty, Karnataka (IN); Minakshi Chakravorty, Karnataka (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/882,414

(22) Filed: Oct. 13, 2015

(65) Prior Publication Data

US 2017/0103152 A1    Apr. 13, 2017

(51) Int. Cl.
*G06F 17/50*    (2006.01)
(52) U.S. Cl.
CPC .................... *G06F 17/5022* (2013.01)
(58) Field of Classification Search
CPC ...... G06F 12/0207; G06F 12/04; G06F 13/16; G06F 13/28; G06F 12/0607; G06F 9/3867; G06F 9/4436; G06F 13/1673; G06F 13/1689; G06F 17/5022; G06F 17/5009; G06F 21/79; G06F 21/86; G06F 2217/62; G06F 2217/84; G06F 2221/2129
USPC .................................................. 716/100–109
See application file for complete search history.

(56) References Cited

U.S. PATENT DOCUMENTS 8,200,469 B2 *  6/2012  Honda ................ G06F 17/5022
                                                           703/14
8,706,467 B2    4/2014  Rabinovitch et al.

* cited by examiner

*Primary Examiner* — Binh Tat
(74) *Attorney, Agent, or Firm* — Fenwick & West LLP

(57) ABSTRACT

A method for reconstructing at least one output signal associated to a sequential logic circuitry block of a circuit is disclosed. At least one input signal is associated to the sequential logic circuitry block. The method comprises simulating a value of the at least one output signal depending on the at least one input signal and determining a transfer function for computing the value of the output signal directly after the simulation timestamp depending on the input signal and/or on the value of the output signal directly before the simulation timestamp. The method further comprises computing the value of the at least one output signal directly after the simulation timestamp as a function value of the transfer function, if a reconstruction condition is fulfilled.

17 Claims, 4 Drawing Sheets

SIGNAL RECONSTRUCTION IN SEQUENTIAL LOGIC CIRCUITRY

BACKGROUND

1. Field of Art

The disclosure relates to the field of circuit design and circuit simulation, in particular of circuits comprising sequential logic circuitry. In more detail, the invention relates to a method, a computer-program product for use in conjunction with a computer system, an integrated circuit and a computer system for reconstructing at least one output signal associated to a sequential logic circuitry block of a circuit.

2. Description of the Related Art

Simulations of circuits are, for example, used during the design of circuits, in particular integrated circuits. To this end, for example hardware description language, HDL, simulations may be used for example for functional verification or debugging of the circuit design.

Storing or dumping of HDL signal values into a storage file, for example a dump file, may be an important part of a verification process, for example during functional verification. The functional verification may for example be part of an electronic design automation, EDA, process. The HDL signals being stored or dumped may for example be displayed as waveforms using a waveform viewer or an HDL debug tool, for example a debug graphical user interface, GUI, which may be used for example by Design/Verification engineers for the sake of debugging.

Storing or dumping signals may, however, increase the storage file size and HDL simulation time. In this respect, dumping of outputs driven by sequential logic may be of particular relevance.

SUMMARY

In this disclosure, an improved concept is provided, which allows for decreased storage file size and simulation time by storing or dumping signals at fewer instants of time, for example by means of an HDL simulator, and reconstruct the signals when they are not stored or dumped using mathematical functions, in particular using a transfer function. In particular, according to the improved concept, signals, for example output signals, of a sequential logic circuitry block are reconstructed using a transfer function during certain phases of simulation. There may be phases when the sequential signal will be reconstructed and other phases when it will get stored or dumped.

According to the improved concept, for an output signal of a sequential logic circuitry block, in particular for each qualified sequential output, a transfer function is determined. It is further determined, when the transfer function is valid, which corresponds to a reconstruction phase, and when it will not be valid, which corresponds to a storing or dump phase. Validity here means that the transfer function correctly reproduces the simulated value of the respective output signal. The HDL debug tool is notified correspondingly about when the transfer function is valid and when not, for example by the HDL simulator. The sequential output is stored into a file during the storing or dump phase and reconstructed using the transfer function during the reconstruction phase, for example by a reader or the HDL debug tool.

According to the improved concept, a method for reconstructing at least one output signal associated to a sequential logic circuitry block of a circuit is provided. Apart from the at least one output signal, at least one input signal is associated to the sequential logic circuitry block. The method comprises simulating a value of the at least one output signal, in particular the value of the at least one output signal directly after a simulation timestamp, depending on the at least one input signal. The method further comprises determining a transfer function for computing the value of the output signal directly after the simulation timestamp depending on the input signal and/or on the value of the output signal directly before the simulation timestamp.

The method further comprises computing the value of the at least one output signal directly after the simulation timestamp as a function value of the transfer function, if a reconstruction condition, in particular a predefined reconstruction condition, is fulfilled. The reconstruction condition depends on the simulation timestamp. In particular, the value of the at least one output signal directly after the simulation timestamp is computed as a function value of the transfer function if and only if the reconstruction condition is fulfilled.

For computing the value of the at least one output signal directly after the simulation timestamp as a function value of the transfer function, one or more arguments of the transfer function are for example read out from a file and/or are computed, for example computed by means of a further transfer function. In particular, the one or more arguments of the transfer function may correspond to respective further output signals of further circuitry blocks of the circuit and as such may be computed or simulated and stored as described for the at least one output signal associated to the circuitry block.

Here and in the following, the expression "sequential logic" refers to a type of logic, wherein an output depends not only on the present values of the inputs, but also on past values of the inputs, that is on an input history. In contrast to sequential logic, in combinational logic the output depends only on the present values of the inputs and not on the input history.

Since the sequential logic circuitry block comprises sequential logic circuitry, the value of the at least one output signal at any given time may depend on a value of the at least one input signal at a time prior to the given time. In particular, this is in contrast to a circuit comprising only combinational logic circuitry, wherein the at least one output signal at any given time would depend only on values of the at least one input signals at the given time.

The simulation timestamp corresponds to a defined instance in time during the simulation of the circuit for example by a HDL simulator tool used for simulating the circuit, for example for simulating the value of the output signal. In particular, the simulation timestamp may correspond to a defined instance in time during the simulation of the circuit associated with one or more simulation events.

According to some implementations of the method, the transfer function has as an argument at least one of the following: the value of the at least one output signal directly before the simulation timestamp, a value of the at least one input signal directly after the simulation timestamp and the value of the at least one input signal directly before the simulation timestamp.

According to some implementations of the method, the circuitry block comprises at least one of a flip-flop, a latch, a counter and another sequential logic circuitry. In particular flip-flops, latches and counters represent sequential logic circuitry. Here and in the following, the expression "flip-flop" is used for clocked flip-flops. That is, herein, flip-flops are always clock-triggered, in particular triggered by edges of the clock signal. On the other hand, here and in the following, the expression "latch" is used for level sensitive latches. In particular, herein, latches are not clock-triggered.

For the simulation of the circuit, the circuitry block may for example be represented by a program code block that may be processed by means of an HDL simulation program.

The at least one input signal may for example comprise one or more data signals, an enable signal, a set signal and/or a reset signal. The at least one input signal may also comprise combinations or functions, in particular Boolean and/or combinational functions, of said signals.

Apart from the at least one input signal and at least one output signal, at least one further input signal and/or at least one further output signal and/or at least one trigger signal may be associated with the circuitry block.

The at least one trigger signal may for example comprise a set signal for a flip-flop or a latch, a reset signal for a flip-flop or a latch and/or a clock signal for a flip-flop.

According to some implementations of the method, the transfer function is determined depending on an electronic component comprised by the circuitry block and/or how electronic components of the circuitry block are interconnected.

According to some implementations of the method, the transfer function is determined to represent or emulate or partially represent or partially emulate an operation of the circuitry block and/or of an electronic component comprised by the circuitry block.

According to some implementations of the method, the transfer function has as an argument the value of the at least one output signal directly before the simulation timestamp and the value of the at least one input signal directly after the simulation timestamp but not the value of the at least one input signal directly before simulation timestamp. This may for example be the case when the transfer function emulates or partially emulates a latch.

According to some implementations of the method, the transfer function has as an argument the value of the input signal directly before simulation timestamp but neither the value of the output signal directly before the simulation timestamp nor the value of the input signal directly after the simulation timestamp. This may for example be the case when the transfer function emulates or partially emulates a flip-flop.

According to some implementations of the method, the transfer function has as an argument the value of the output signal directly before the simulation timestamp but neither the value of the input signal directly after the simulation timestamp nor the value of the input signal directly before the simulation timestamp. This may for example be the case when the transfer function emulates or partially emulates a counter.

Apart from the value of the at least one output signal directly before the simulation timestamp and/or the value of the at least one input signal directly before and/or after the simulation timestamp, the transfer function may have further arguments. The further arguments may for example correspond to or depend on the at least one further input signal, the reset signal, the enable signal and/or the at least one trigger signal, for example the clock signal.

Since, according to the improved concept, the value of the at least one output signal directly after the simulation timestamp is computed based on the transfer function if the reconstruction condition is fulfilled, it is not necessary to store or dump the simulated value of the at least one output signal directly after the simulation timestamp into a file in this case. Instead, for further usage, for example for generating a waveform for example by means of an HDL reader tool, a waveform viewer tool, an HDL debug tool and/or a GUI tool for HDL debugging, the computed value of the at least one output signal may be used. Therein, the waveform may for example represent the output signal or a signal depending on the output signal as a function of time.

In other words, if the reconstruction condition is fulfilled, the value of the at least one output signal directly after the simulation timestamp is reconstructed, in particular by means of the transfer function and the simulated value is not necessarily stored. Consequently, a size of a storage file, for example a dump file, for storing simulation outputs, in particular the value of the at least one output signal, may be reduced. In addition, for the same reason also a simulation time may be reduced according to the improved concept.

According to some implementations of the method, the method further comprises storing the simulated value of the at least one output signal directly after the simulation timestamp into a file, for example a storage file, in particular a dump file, if the reconstruction condition is not fulfilled. In particular, the simulated value of the at least one output signal directly after the simulation timestamp is stored into the file if and only if the reconstruction condition is not fulfilled. That is, the simulated value of the at least one output signal directly after the simulation timestamp is not stored if the reconstruction condition is fulfilled.

In this way, either the stored value of the output signal directly after the simulation timestamp or the value of the output signal directly after the simulation timestamp computed as the function value of the transfer function may be utilized for the further usage, depending on whether the reconstruction condition is fulfilled or not. Consequently, no information is lost, but at the same time, the size of the file and/or simulation time may be reduced.

According to some implementations of the method, the method further comprises determining the reconstruction condition depending on the transfer function and the circuitry block, in particular depending on the transfer function and on at least one electronic component of the circuitry block.

For example, the reconstruction condition may be determined depending on the transfer function and the electronic component the transfer function represents or emulates or partially represents or emulates. Then, the reconstruction condition is for example fulfilled if, in particular if and only if, the transfer function correctly represents or emulates the electronic component.

According to some implementations of the method, the reconstruction condition is fulfilled if, in particular if and only if, computing the value of the at least one output signal directly after the simulation timestamp as the function value of the transfer function and simulating the value of the at least one output signal directly after the simulation timestamp yield the same result. In particular, the reconstruction condition is predefined and/or determined such that it is fulfilled if computing the value of the output signal directly after the simulation timestamp as the function value of the transfer function and simulating the value of the output signal directly after the simulation timestamp do yield the same result.

In this way, it is for example ensured that the further usage, for example the generation of the waveform, does not depend on the particular choice of the transfer function. Since the transfer function is for example only utilized when it generates the same result as the HDL simulation, the waveform is the same as if all values of the output signal used for the waveform were simulated by the HDL simulation.

According to some implementations of the method, the reconstruction condition is not fulfilled if, in particular if and only if, computing the value of the at least one output signal directly after the simulation timestamp as the function value of the transfer function and simulating the value of the at least one output signal directly after the simulation timestamp do not yield the same result, in particular yield different results.

The size of the file may be efficiently reduced, since the simulated value of the output signal is for example stored into the file only if said results of the computing as a function value of the transfer function and the simulation yield different results.

According to some implementations of the method, the reconstruction condition is defined to be not fulfilled for specific cases, even if computing the value of the output signal directly after the simulation timestamp as the function value of the transfer function and simulating the value of the output signal directly after the simulation timestamp yield the same result. Such implementations may for example be advantageous if for the specific cases the determination whether the same result is yielded are not is very complex or involved.

According to some implementations of the method, simulating the value of the at least one output signal depending on the at least one input signal is performed using a hardware description language, HDL, simulation, for example a Verilog simulation, a SystemVerilog simulation or a Very-High-Speed-Integrated-Circuit-Hardware-Description-Language, VHDL, simulation. In particular, simulating the value of the at least one output signal depending on the at least one input signal is performed by means of an HDL simulator tool.

Computing the value of the output signal directly after the simulation timestamp as a function value of the transfer function is for example not performed by the HDL simulator tool. For example, the computing of the value of the output signal directly after the simulation timestamp as a function value of the transfer function is performed by a debug tool, an HDL debug tool and/or a waveform viewer.

The circuitry block may for example be represented by a block of Verilog or VHDL statements, for example comprised by a Verilog always-block or a respective block of HDL statements.

According to some implementations of the method, the circuitry block comprises a flip-flop, in particular a clocked flip-flop, in particular an edge-triggered flop-flop.

In such implementations, a clock signal is associated to the circuitry block and the input signal comprises for example a data signal, a set signal and/or a reset signal. The input signal may also comprise a function, a combination or vector of said data, set or reset signals.

According to some implementations of the method, in particular wherein the circuitry block comprises a flip-flop, the function value of the transfer function is given by or depends on the value of the at least one input signal directly before simulation timestamp.

The function value may for example depend or not depend on the value of the at least one further input signal, the set signal, the reset signal and/or the at least one trigger signal.

Such a transfer function may for example be suitable for computing the value of the output signal, when the operation of the circuitry block corresponds to capturing and providing as the output signal the value of the input signal at rising edges and/or falling edges of the clock signal. This may for example correspond to the operation of a D-flip-flop.

According to some implementations of the method, in particular wherein the circuitry block comprises a flip-flop, a reset signal is associated to the circuitry block. Depending on a value of the reset signal, in particular a value of the reset signal directly before the simulation timestamp and/or a value of the reset signal directly after the simulation timestamp, the function value of the transfer function is given by or depends on either the value of the at least one input signal directly before the simulation timestamp or a reset value.

According to some implementations of the method, the circuitry block comprises a latch, in particular a level sensitive latch.

In such implementations, the input signal comprises for example to a data signal, a set signal, a reset signal and/or an enable signal. The input signal may also comprise a function, a combination or vector of said data, set, reset and/or enable signals.

According to some implementations of the method, in particular wherein the circuitry block comprises a latch, an enable signal is associated to the circuitry block. Depending on a value of the enable signal directly after the simulation timestamp, the function value of the transfer function is given by or depends on either value of the at least one input signal directly after the simulation timestamp or the value of the at least one output signal directly before simulation timestamp.

Such a transfer function may for example be suitable for computing the value of the output signal, when the operation of the circuitry block corresponds to providing transparently the input signal as the output signal or keeping the output signal constant depending on the value of the enable signal. This may for example correspond to the operation of a gated D-latch.

According to some implementations of the method, in particular wherein the circuitry block comprises a latch, an enable signal and a reset signal are associated to the circuitry block. Depending on the value of the enable signal directly after the simulation timestamp and on a value of the reset signal, in particular a value of the reset signal directly before the simulation timestamp and/or a value of the reset signal directly after the simulation timestamp, the function value of the transfer function is given by or depends on either the value of the at least one input signal directly after the simulation timestamp or the value of the at least one output signal directly before the simulation timestamp or a reset value.

According to some implementations of the method, the method further comprises generating a waveform representing the at least one output signal or a function of the at least one output signal. Therein, the value of the at least one output signal directly after the simulation timestamp computed as a function value of the transfer function is used if the reconstruction condition is fulfilled. Further, the value of the at least one output signal directly after the simulation timestamp simulated and stored to the file is used if the reconstruction condition is not fulfilled.

According to some implementations of the method, the method is performed by means of a circuit design tool, in particular by an electronic design automation, EDA, tool.

In such implementations, the method according to the improved concept may be used during a part of a circuit design flow, particular an EDA design flow. In particular, the method according to the improved concept may be used during functional verification within such a design flow.

According to the improved concept, also a computer-program product for use in conjunction with a computer system is provided. The computer-program product comprises a tangible and non-transitory computer-readable storage medium and a computer-program mechanism embedded therein for configuring the computer system to reconstruct at least one output signal associated to a sequential logic circuitry block of a circuit is provided. Apart from the at least one output signal, at least one input signal is associated to the sequential logic circuitry block. The computer-program mechanism includes instructions for simulating a value of the at least one output signal, in particular the value of the at least one output signal directly after a simulation timestamp, depending on the at least one input signal and instructions for determining a transfer function for computing the value of the output signal directly after the simulation timestamp depending on the input signal and/or on the value of the output signal directly before the simulation timestamp. The computer-program mechanism also includes instructions for computing the value of the at least one output signal directly after the simulation timestamp as a function value of the transfer function if a reconstruction condition is fulfilled.

Further implementations of the computer-program product are readily derived by any person skilled in the art from the various implementations and embodiments of the method and vice versa.

According to the improved concept, also a computer system is provided, the computer system comprising at least one processor, a memory and a program module. The memory is a tangible and non-transitory computer-readable memory. The program module is stored in the memory and configured to be executed by at least one processor to reconstruct at least one output signal associated to a sequential logic circuitry block of a circuit. Apart from the at least one output signal, at least one input signal is associated to the sequential logic circuitry block. The program module includes instructions for simulating a value of the at least one output signal, in particular the value of the at least one output signal directly after a simulation timestamp, depending on the at least one input signal and instructions for determining a transfer function for computing the value of the output signal directly after the simulation timestamp depending on the input signal and/or on the value of the output signal directly before the simulation timestamp. The program module also includes instructions for computing the value of the at least one output signal directly after the simulation timestamp as a function value of the transfer function if a reconstruction condition is fulfilled.

Further implementations of the computer system are readily derived by any person skilled in the art from the various implementations and embodiments of the method and the computer-program product, respectively, and vice versa.

According to the improved concept, also an integrated circuit configured to reconstructing at least one output signal associated to a sequential logic circuitry block of a circuit is provided. Apart from the at least one output signal, at least one input signal is associated to the sequential logic circuitry block. The integrated circuit is configured to simulate a value of the at least one output signal, in particular the value of the at least one output signal directly after a simulation timestamp, depending on the input signal and to determine a transfer function for computing the value of the output signal directly after the simulation timestamp depending on the input signal and/or on the value of the output signal directly before the simulation timestamp. The integrated circuit is further configured to compute the value of the at least one output signal directly after the simulation timestamp as a function value of the transfer function if a reconstruction condition is fulfilled.

Further implementations of the integrated circuit are readily derived by any person skilled in the art from the various implementations and embodiments of the method, the computer-program product and the computer system, respectively, and vice versa.

BRIEF DESCRIPTION OF DRAWINGS

In the following, the improved concept is explained in detail with the aid of exemplary implementations by reference to the drawings. Components that are functionally identical or have an identical effect may be denoted by identical references.

Identical components and/or components with identical effects may be described only with respect to the figure where they occur first and their description is not necessarily repeated in subsequent figures.

DETAILED DESCRIPTION

Figure 1:
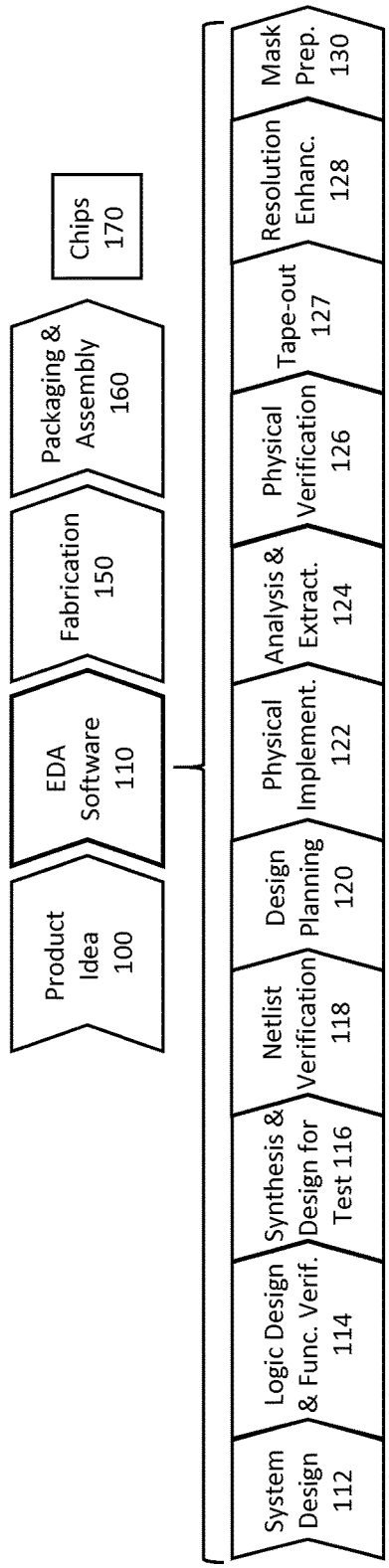
FIG. 1 shows a simplified representation of an illustrative integrated circuit design flow.

FIG. 1 shows a simplified representation of an illustrative design flow for designing an electronic circuit in particular an integrated circuit, IC. An implementation of a method according to the improved concept may for example be embedded within such design flow. However, an implementation of a method according to the improved concept may also be utilized within another design flow or independently from a design flow.

At a high level, the process starts with the product idea (step 100) and is realized in an Electronic Design Automation, EDA, software design process (step 110). When the design is finalized, it can be taped-out (step 127). At some point after tape-out, the fabrication process (step 150) and packaging and assembly processes (step 160) occur, resulting ultimately in finished IC chips (result 170).

The EDA software design process (step 110) itself is composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the component steps of the EDA software design process (step 110) is provided.

System design (step 112): Designers describe functionalities they want to implement. They may perform what-if planning to refine functionality, check costs, etc. Hardware-software architecture partitioning may be carried out at this stage. Example EDA software products from Synopsys, Inc. that can be used at this step include Model Architect, Saber, System Studio, and DesignWare® products.

Logic design and functional verification (step 114): At this stage, a VHDL, SystemVerilog or Verilog code for modules in the system is written and the design is checked for functional accuracy. More specifically, the design is checked to ensure that it produces correct outputs in response to particular input stimuli. Example EDA software products from Synopsys, Inc. that can be used at this step include VCS, VERA, DesignWare®, Magellan, Formality, ESP and LEDA products. Aspects of the invention, for example a method according to the improved concept, may be performed during this step 114.

Synthesis and design for test (step 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, DFT Compiler, Power Compiler, FPGA Compiler, TetraMAX, and DesignWare® products.

Netlist verification (step 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 120): Here, an overall floorplan for the chip is constructed and analyzed for timing and top-level routing. Example EDA software products from Synopsys, Inc. that can be used at this step include Astro and Custom Designer products.

Physical implementation (step 122): The placement (positioning of circuit elements) and routing (connection of the same) is carried out in this step (place-and-route process). Example EDA software products from Synopsys, Inc. that can be used at this step include the Astro, IC Compiler, and Custom Designer products.

Analysis and extraction (step 124): In this step, the circuit function is verified at a transistor level, in turn permitting what-if refinement. Example EDA software products from Synopsys, Inc. that can be used at this step include Astro-Rail, PrimeRail, PrimeTime, and Star-RCXT products.

Physical verification (step 126): At this step various checking functions are performed to ensure correctness for: manufacturing, electrical issues, lithographic issues, and circuitry. Example EDA software products from Synopsys, Inc. that can be used at this step include the Hercules product.

Tape-out (step 127): This step provides the "tape-out" data to be used (after lithographic enhancements are applied if appropriate) for production of masks for lithographic use to produce finished chips. Example EDA software products from Synopsys, Inc. that can be used at this step include the IC Compiler and Custom Designer families of products.

Resolution enhancement (step 128): This step involves geometric manipulations of the layout to improve manufacturability of the design. This step for example includes optical proximity correction, OPC. Example EDA software products from Synopsys, Inc. that can be used at this step include Proteus, ProteusAF, and PSMGen products.

Mask data preparation (step 130): This step provides mask-making-ready "tape-out" data for production of masks for lithographic use to produce finished chips. Example EDA software products from Synopsys, Inc. that can be used at this step include the CATS® family of products. Often this step includes partitioning or fracturing non-rectangular shaped islands into rectangles.

As mentioned, aspects of the invention may be performed during logic design and functional verification (step 114). However, it may also be suitable to perform aspects of the invention during other steps of the EDA process or during steps of another circuit design process.

Figure 2A:
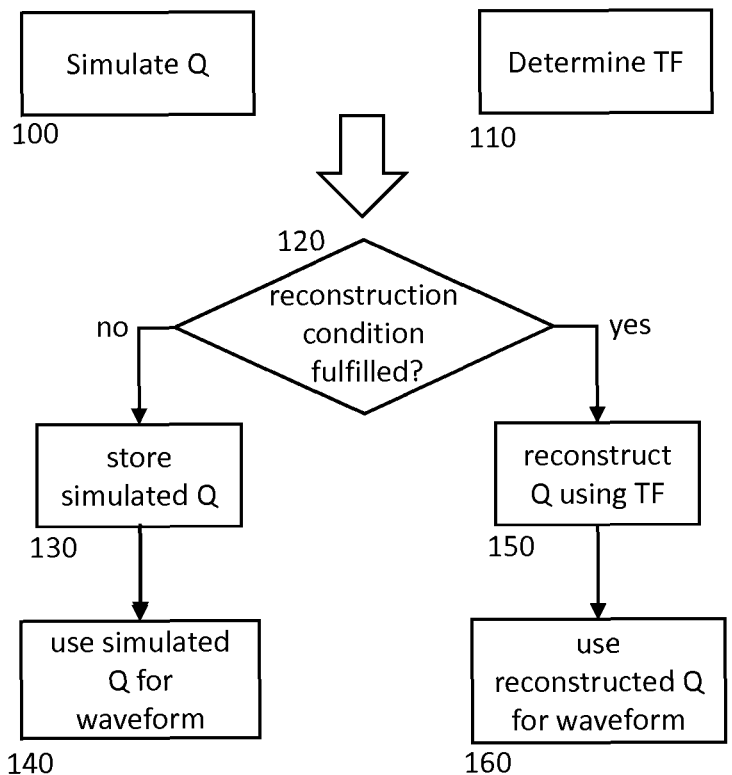
FIG. 2A shows a flow chart of an exemplary implementation of a method according to the improved concept.
Figure 2B:
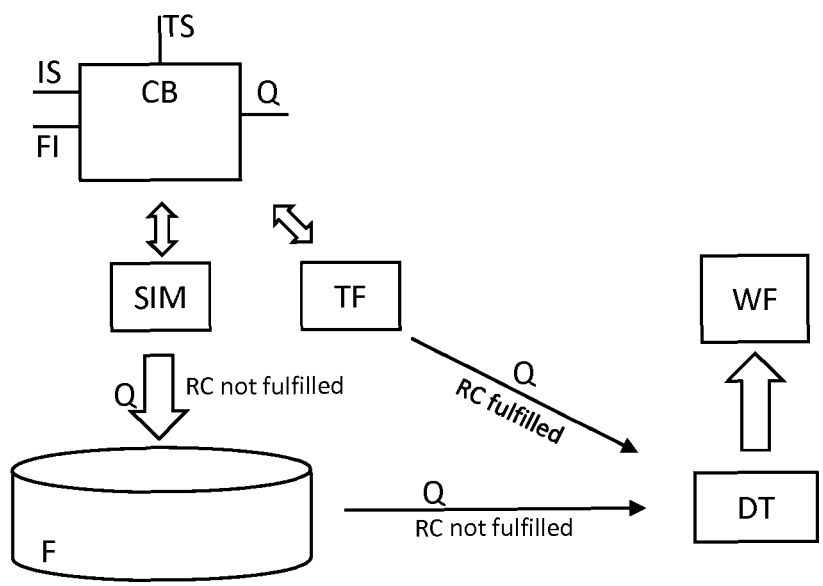
FIG. 2B shows a schematic representation of an exemplary implementation of a method according to the improved concept.

FIGS. 2A and 2B show a flow chart and a schematic representation, respectively, of an exemplary implementation of a method for simulating a circuit according to the improved concept.

An electronic circuit to be simulated may for example be represented by means of an HDL, for example Verilog, SystemVerilog or VHDL. A corresponding simulator tool, in particular a HDL simulator SIM, for example a Verilog simulator, a SystemVerilog simulator or a VHDL simulator, such as for example VCS of Synopsys, Inc., may be used for the simulation as depicted in FIG. 2B.

The circuit comprises at least one sequential logic circuitry block CB and has at least one associated input signal IS and at least one associated output signal Q. At any given time, a value of the output signal Q depends on a value of the at least one input signal IS at a time prior to the given time, according to the definition of sequential logic.

As shown in block 100 of FIG. 2A, a value of the output signal Q is simulated depending on the at least one input signal IS, for example by means of the HDL simulator SIM. Therein, the value of the output signal Q may depend also on optional further input signals FI and/or on optional trigger signals TS.

As depicted in block 110 of FIG. 2A and in FIG. 2B, furthermore a transfer function TF is determined for the circuitry block CB. The transfer function TF may have as an argument the value of the output signal Q directly before a simulation timestamp TS. Alternatively or in addition, the transfer function TF may have as an argument the value the at least one input signal IS directly after the simulation timestamp TS. Alternatively or in addition, the transfer function TF may have as an argument the value of the at least one input signal IS directly before the simulation timestamp TS. The transfer function has as a function value the value of the output signal Q directly after the simulation timestamp TS at least if a reconstruction condition RC is fulfilled.

In block 120 of FIG. 2A, it is determined whether the reconstruction condition RC is fulfilled, in particular at the simulation timestamp TS. Therein, the reconstruction condition RC is fulfilled if, for example if and only if, simulating the value of the output signal Q directly after the simulation timestamp TS yields the same result as computing the value of the output signal Q as a function value of the transfer function TF.

If the reconstruction condition RC is not fulfilled, the simulated value of the output signal Q directly after the simulation timestamp TS is stored in a file F, for example a dump file, according to block 130 of FIG. 2A and as shown in FIG. 2B. The file F may for example be a FSDB or a VPD file. Then, the simulated and stored value of the output signal Q may for example be read out from the file F and used for generating a waveform WF according to block 140 of FIG. 2A and as shown in FIG. 2B.

On the other hand, if the reconstruction condition RC is fulfilled, the value of the output signal Q directly after the simulation timestamp TS is reconstructed using the transfer function TF according to block 150 of FIG. 2A. That is, the value of the output signal Q is computed as a function value of the transfer function TF. In this case, the simulated value of the output signal Q is not stored into the file F. Consequently, according to block 160 of FIG. 2A, the reconstructed value of the output signal Q is used for generating the reform WF.

Since the value of the output signal Q is only stored if the reconstruction condition RC is not fulfilled, a size of the file F and also simulation time may be reduced by means of the improved concept.

The waveform WF may for example be generated by a debug tool DT or a waveform viewer or an HDL reader as shown in FIG. 2B. An example software product that may be used as a debug tool DT or a waveform viewer is Verdi of Synopsys, Inc.

The exact choice of the transfer function TF in block 110 of FIG. 2A depends on the detailed structure and content of the circuitry block CB. In particular, the transfer function TF is for example chosen to closely represent or emulate the hardware behavior of the circuitry block CB, that is behavior of one or more electronic components comprised by the circuitry block CB. In the following, several examples are given for the transfer function TF representing different electronic components of the circuitry block CB.

In HDL simulations performed by an HDL simulator SIM, any signal, for example the at least one input signal IS, such as the data signal D, the enable signal E, the set signal S, the reset signal R, the at least one further input signal FI and/or the at least one trigger signal TS, such as the clock signal C, may have multiple values in a given simulation timestamp TS. For reconstruction, that is for computation by means of the transfer function TF, for example only a final value of a respective signal is used.

Consequently, a unique choice of the transfer function TF yielding the same result for the output signal Q as the simulation under any circumstances, in particular for any signal sequence, may not exist. Therefore, the transfer function TF is for example chosen to closely represent or emulate the hardware behavior of the circuitry block CB. Then, the transfer function TF may be used for the reconstruction when, for example always when, it is guaranteed that the computation of the output value Q by means of the transfer function TF gives the same result as the respective simulation, that is when the reconstruction condition RC is fulfilled.

The HDL simulator SIM may for example communicate to the reader, waveform viewer and/or debug tool DT, for which cases, time periods and/or simulation timestamps TS the reconstruction condition RC is fulfilled and for which it is not fulfilled.

In the following, Verilog statements, program code examples and/or pseudocode examples will be used to represent the circuit block CB in terms of the HDL. Note that Verilog "begin" and "end" statements may be omitted for the sake of brevity. For an HDL other than Verilog, it is straightforward for any person skilled in the art to adapt the representation.

A latch, for example a gated D-latch, of the circuitry block CB may be represented by the Verilog always-block:

always@(E,D)

if(E)

$$Q<=D; \quad (1)$$

Therein, D represents a data input signal, E an enable signal and Q the output signal of the latch. The statements under the always block (1) are evaluated by the HDL simulator SIM always when a change in the enable signal E or the data signal D occurs. In this case, the value of the data signal D is assigned to the output signal Q if the enable signal E is logic high. Consequently, the following transfer function TF, expressed in Verilog syntax, may be chosen:

$$TF:Qr=(E===1'b1)?D:Q' \quad (2)$$

Therein, Qr represents the reconstructed value of the output signal directly after the simulation timestamp TS in question, E represents the enable signal directly after the simulation timestamp TS, D represents the input or data signal directly after the simulation timestamp TS and Q' represents the value of the output signal directly before the simulation timestamp TS. Equation (2) means that the reconstructed value of the output signal Qr is given by the data signal D directly after the simulation timestamp TS if the enable signal E directly after the simulation timestamp TS is logic high. Otherwise, the reconstructed value of the output signal Qr is given by the value of the output signal Q' directly before the simulation timestamp TS.

Figure 3A:
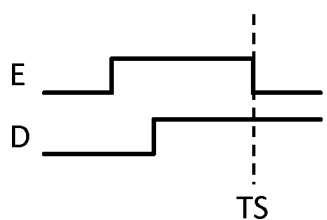
FIGS. 3A, 3B, 3C, 3D and 3E show different exemplary signal sequences of circuits to be simulated by means of exemplary implementations of a method according to the improved concept.

In this case, the reconstruction condition RC is at least fulfilled for each simulation timestamp TS, when the always block (1) is evaluated exactly once in the respective simulation timestamp TS. An example is shown in FIG. 3A, where the enable signal E changes for example from logic high to logic low at the simulation timestamp TS, while the data signal D remains unchanged in the simulation timestamp TS. According to the transfer function TF of equation (2), the reconstructed output signal Qr is then given by the value of the output signal Q' directly before the simulation timestamp TS, in agreement with the hardware behavior of the D-latch and the simulated value of the output signal Q.

Figure 3B:
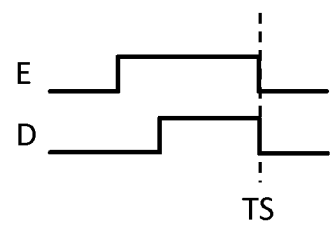

In contrast, the reconstruction condition RC may not be fulfilled if the always block (1) is evaluated more than once in the simulation timestamp TS. An example is shown in FIG. 3B. Here, the enable signal E as well as the data signal D change for example from logic high to logic low in the simulation timestamp TS. In case the data signal D changes before the enable signal E, the simulated value of the output signal Q directly after the simulation timestamp TS would be logic low, while the reconstructed output signal Qr according to the transfer function TF of equation (2) would be given by the value of the output signal Q' directly before the simulation timestamp TS, which is logic high in this case.

Figure 3C:
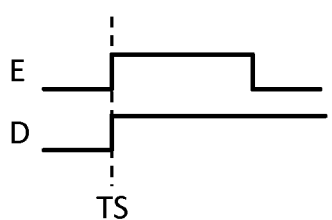

In the other hand, the reconstruction condition RC may be fulfilled also if the always block (1) is evaluated more than once in the simulation timestamp TS, as long as the value of the output signal Q' directly before the simulation timestamp TS is not called according to the transfer function TF of equation (2). An example is shown in FIG. 3C. Here, the enable signal E as well as the data signal D change for example from logic low to logic high in the simulation timestamp TS. In this case, the simulated value of the output signal Q directly after the simulation timestamp TS as well as the reconstructed output signal Qr according to the transfer function TF of equation (2) would be logic high and the reconstruction condition RC would be fulfilled.

Figure 3D:
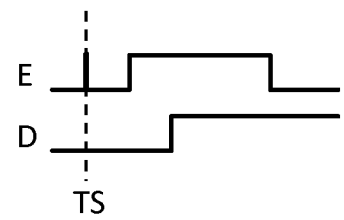

Another example where the reconstruction condition is not fulfilled when the always block (1) is evaluated more than once in the simulation timestamp TS is shown in FIG. 3D. Here, the simulation timestamp TS coincides with a glitch in the enable signal E. That is the enable signal E changes for example from logic low to logic high and back to logic low within the simulation timestamp TS. The data signal D remains constant at logic low in the simulation timestamp TS. In this case, the simulated value of the output signal Q directly after the simulation timestamp TS would be logic low, that is the output signal Q would be forced to logic low by the glitch in the enable signal E. The reconstructed output signal Qr according to the transfer function TF of equation (2), however, would be given by the value of the output signal Q' directly before the simulation timestamp TS, which is not necessarily logic low in this case.

Another example for a latch, for example a gated D-latch with an associated reset input, of the circuitry block CB may be represented by the Verilog always-block:

always@($E,D,R$)

if($R$)

$Q<=0$;

if($E$)

$Q<=D$;                   (3)

Therein, R is a reset signal the latch. The statements under the always block (3) are evaluated by the HDL simulator SIM always when a change in the enable signal E, the data signal D or the reset signal R occurs. In this case, logic low is assigned to the output signal Q if the value of the reset signal is logic high. The data signal D is assigned to the output signal Q if the enable signal E is logic high. Consequently, the following transfer function TF, expressed in Verilog syntax, may be chosen:

$$TF:Qr=(R===1'b1)?1'b0:(E===1'b1)?D:Q' \quad (4)$$

Equation (4) means that the reconstructed value of the output signal Qr is logic low if the reset signal R directly after the simulation timestamp TS is logic high. Otherwise, the transfer function TF of equation (4) corresponds to the transfer function TF of equation (2).

Figure 3E:
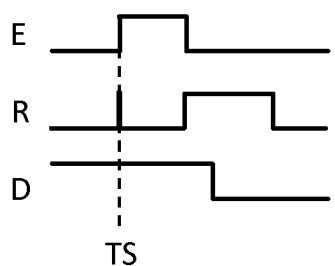

Regarding the reconstruction condition RC being fulfilled or not, what has been explained with respect to the always block (1) and the transfer function (2) holds analogously for the always block (3) and the transfer function (4). Another example, where the reconstruction condition is not fulfilled when the always block (3) is evaluated more than once in the simulation timestamp TS is shown in FIG. 3E. Here, the simulation timestamp TS coincides with a glitch in the reset signal R and with a change of the enable signal E from logic low to logic high. The data signal D remains constant at logic high in the simulation timestamp TS. In this case, the glitch in the reset signal R may force the output signal Q to logic low because of untimely reset.

A flip-flop, for example a D-flip-flop triggered by rising edges of a clock signal C, of the circuitry block CB may be represented by the Verilog always-block:

always@(posedge $C$)

$Q<=D$;                   (5)

The statements under the always block (5) are evaluated by the HDL simulator SIM at every positive or rising edge (denoted as "posedge") of the clock signal C. Then, the data signal D is assigned to the output signal Q. Consequently, the following transfer function TF may be chosen:

$$TF:Qr=D' \quad (6)$$

Therein, D' represents the value of the data signal directly before the simulation timestamp TS. That is, the reconstructed value of the output signal Qr is given by the data signal D' directly before the simulation timestamp TS.

Figure 4A:
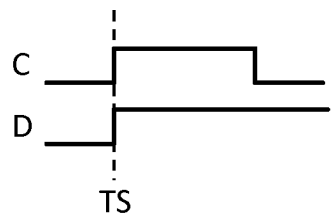
FIGS. 4A, 4B, 4C and 4D show further different exemplary signal sequences of circuits to be simulated by means of exemplary implementations of a method according to the improved concept.

In this case, the reconstruction condition RC may not be fulfilled in case of a rising edge of the clock signal C and a change of the data signal D in the respective simulation timestamp TS if the data signal D changes before the clock signal C in the simulation timestamp TS. An example is shown in FIG. 4A. Here, the clock signal C as well as the data signal D change for example from logic low to logic high in the simulation timestamp TS.

Figure 4B:
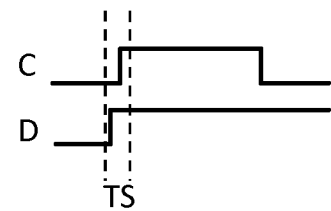

In case the data signal D changes before the clock signal C, as shown schematically in FIG. 4B, the simulated value of the output signal Q directly after the simulation timestamp TS would be logic high. On the other hand, the reconstructed value of the output signal Qr according to the transfer function TF of equation (6) would be given by the value of the data signal D' directly before the simulation timestamp TS, which is logic low in this case. Thus, the reconstruction condition RC is not fulfilled in this case.

Figure 4C:
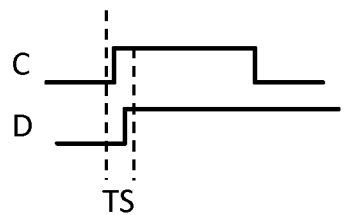

In case the data signal D changes after the clock signal C, as shown schematically in FIG. 4C, the simulated value of the output signal Q directly after the simulation timestamp TS would be logic low just as the reconstructed output signal Qr according to the transfer function TF of equation (6). Thus, the reconstruction condition RC is fulfilled in this case.

Figure 4D:
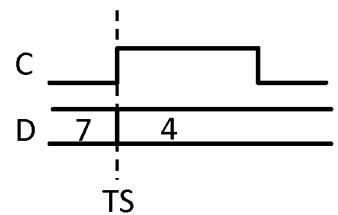

A similar example is shown in FIG. 4D, where the clock signal C has a rising edge in the simulation timestamp TS and the data signal D changes from 7 to 4 in the simulation time stamp (the data signal D represents for example a vector of individual signals in this case). In analogy to FIG. 4A, here the simulated value of the output signal Q directly after the simulation timestamp TS would be 4, while the reconstructed value of the output signal Qr according to the transfer function TF of equation (6) would be 7 if the data signal D changes before the clock signal C. Then the reconstruction condition RC would not be fulfilled. On the other hand, if the data signal D changes after the clock signal C in the simulation timestamp TS, the simulated value of the output signal Q as well as the reconstructed value of the output signal Qr would be 7. Then, the reconstruction condition RC would be fulfilled.

Furthermore, the reconstruction condition RC may not be fulfilled if the simulation timestamp TS coincides with a glitch in the clock signal C.

Another example for a flip-flop, for example a D-flip-flop triggered by rising edges of a clock signal C with an associated reset input, of the circuitry block CB may be represented by the Verilog always-block:

always@(posedge $C$,posedge $R$)

if($R$)

$Q<=RV$;

else $Q<=D$;                   (7)

Therein, RV is a reset value that may be constant, for example logic low, or may be dynamically changing. The statements under the always block (7) are evaluated by the HDL simulator SIM at every positive or rising edge of the clock signal C and at every positive or rising edge of the reset signal R. Then, the reset value RV is assigned to the output signal Q if the reset signal R is logic high and the data signal D is assigned to the output signal Q otherwise. Consequently, the following transfer function TF, expressed in Verilog syntax, may be chosen:

$$TF:Qr=(R'===1'b1)?RV':D' \quad (8)$$

That is, the reconstructed value of the output signal Qr is given by a reset value RV' directly before the simulation timestamp TS if the reset signal R' directly before the simulation timestamp TS is logic high. Otherwise, the reconstructed value of the output signal Qr is given by the data signal D' directly before the simulation timestamp TS. Regarding the reconstruction condition RC being fulfilled or not, what has been explained with respect to the always block (5) and the transfer function (6) holds analogously for the always block (7) and the transfer function (8). Another example, where the reconstruction condition may not be fulfilled is if the simulation timestamp TS coincides with a glitch in the reset signal R.

Figure 5:
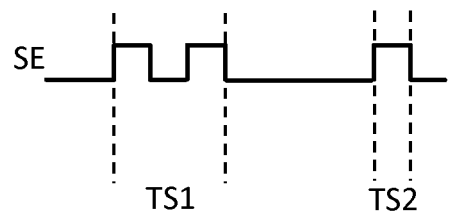
FIG. 5 shows a further exemplary signal sequence of a circuit to be simulated by means of exemplary implementations of a method according to the improved concept.

To visualize that a signal may assume multiple values in a given simulation timestamp, FIG. 5 shows a sequence of an exemplary signal SE, which may correspond to any signal associated to the circuitry block CB. The exemplary signal SE may for example correspond to the at least one input signal IS, the data signal D, the enable signal E, the set signal S, the reset signal R, the at least one further input signal FI, the at least one trigger signal TS or the clock signal C or a function of said signals.

The exemplary signal SE changes for example four times in a first simulation timestamp TS1. For example, the exemplary signal SE changes from logic low to logic high, back to logic low and then again to logic high and back to logic low in the first simulation timestamp TS1. In a second simulation timestamp TS2, the exemplary signal changes for example twice, for example from logic low to logic high and back to logic low.

Figure 6:
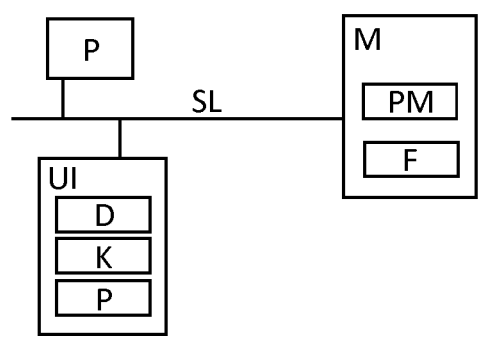
FIG. 6 shows an exemplary implementation of a computer system according to the improved concept.

FIG. 6 shows an exemplary implementation of a computer system according to the improved concept. The computer system comprises at least one processor P connected to one or more signal lines SL. The signal lines SL may for example constitute a communication bus. The computer system also comprises a user interface UI connected to the one or more signal lines SL, the user interface UI comprising for example a display D, a keyboard K and/or a pointer device P such as a mouse.

The computer system also comprises a computer-readable memory M connected to the one or more signal lines. The memory M may for example comprise the file F. Furthermore, the memory M comprises a program module PM. The program module PM is configured to be executed by the at least one processor P to simulate a circuit by means of a method according to the improved concept. In particular, the program module PM comprises instructions for simulating the value of the output signal Q depending on the at least one input signal IS, for determining the transfer function TF for computing the value of the output signal, in particular a reconstructed output signal Qr.

It is pointed out that the components of the circuitry block CB, in particular the latches and flip-flops, described herein can only represent a fraction of possible components that may be treated according to the improved concept. In particular, other kinds of sequential logic circuitry components, such as other kinds of flip-flops, latches as well as counters, may be comprised by the circuitry block CB.

Is also highlighted that for a given circuitry block CB, several choices of the transfer function TF according to the improved concept may be possible. These different choices may consequently correspond to different reconstruction conditions RC.

For any chosen transfer function TF according to the respective circuitry block CB, the determination for which situations the respective reconstruction condition RC is fulfilled or is not fulfilled, may be carried out by any person skilled in the art depending on the specific case. The examples discussed herein, for example with respect to FIGS. 3A to 4D, are chosen for explanatory reasons and are not to be considered limiting in any sense.

By means of the improved concept, accurate reconstruction of signals driven by sequential logic circuitry, in particular by flip-flops and/or latches, and thereby reducing HDL simulation time and file size, in particular a dump size, may be achieved. In this way, simulator performance may be greatly enhanced.

Handling of sequential logic outputs, such as outputs of latches and flip-flops, according to the improved concept may reduce the dumping overhead several times, for example up to five times, for example in register transfer level, RTL, designs.

For sequential logic, HDL simulators can have multiple values of any signal in a given simulation timestamp TS where typically only the final value of the signal is used for reconstruction. Furthermore, a HDL simulator may have multiple queues. During reconstruction, there may be only one queue per simulation timestamp TS. In addition, signal glitches are typically not dumped, so any simulation change due to glitches is oblivious to the reader/HDL debug GUI. Accurate dumping may require matching the exact simulator behavior in the presence of races and glitches. These challenges coming along with sequential logic may be overcome by means of the improved concept.

In this discloses storing or dumping of any signal may for example refer to storing or dumping, respectively, a value of the signal.

What is claimed is:

1. A computer-implemented method for reconstructing at least one output signal associated to a sequential logic circuitry block of a circuit, at least one input signal being associated to the circuitry block, the method comprising:
    simulating, through a computer, a value of the at least one output signal depending on the at least one input signal;
    determining, through the computer, a transfer function for computing the value of the at least one output signal directly after a simulation timestamp depending on at least one of the at least one input signal and on the value of the at least one output signal directly before the simulation timestamp;
    computing, by the computer, the value of the at least one output signal directly after the simulation timestamp as a function value of the transfer function if a predefined reconstruction condition is fulfilled; and
    storing, by the computer, the simulated value of the at least one output signal directly after the simulation timestamp into a file if the reconstruction condition is not fulfilled.

2. The method of claim 1, wherein the transfer function has as an argument at least one of the following:
    the value of the at least one output signal directly before the simulation timestamp;

a value of the at least one input signal directly after the simulation timestamp; and the value of the at least one input signal directly before the simulation timestamp.

3. The method according to claim 1, further comprising determining, by the computer, the reconstruction condition depending on the transfer function and the circuitry block.

4. The method of claim 1, wherein the reconstruction condition is fulfilled if computing the value of the at least one output signal directly after the simulation timestamp as the function value of the transfer function and simulating the value of the at least one output signal directly after the simulation timestamp yield the same result.

5. The method of claim 1, wherein the circuitry block comprises at least one of a flip-flop, a latch, a counter and another sequential logic circuit.

6. The method of claim 1, wherein the circuitry block comprises a flip-flop, in particular a clocked flip-flop, in particular an edge-triggered flop-flop.

7. The method of claim 6, wherein the function value of the transfer function is given by or depends on the value of the at least one input signal directly before the simulation timestamp.

8. The method of claim 1, wherein the circuitry block comprises a latch, in particular a level sensitive latch.

9. The method of claim 8, wherein an enable signal is associated to the circuitry block and, depending on a value of the enable signal directly after the simulation timestamp, the function value of the transfer function is given by or depends on either the value of the at least one input signal directly after the simulation timestamp or the value of the output signal directly before the simulation timestamp.

10. The method of claim 1, further comprising generating, through the computer, a waveform representing the output signal or a function of the output signal using the value of the output signal directly after the simulation timestamp computed as a function value of the transfer function if the reconstruction condition is fulfilled and using the value of the output signal directly after the simulation timestamp simulated and stored to the file if the reconstruction condition is not fulfilled.

11. The method of claim 1, wherein the simulating the value of the output signal depending on the at least one input signal is performed using a hardware description language, HDL, simulation, in particular a Verilog simulation or a Very-High-Speed-Integrated-Circuit-Hardware-Description-Language, VHDL, simulation.

12. The method of claim 1, wherein the method is performed by means of a circuit design tool, in particular by an electronic design automation, EDA, tool.

13. A computer-program product for use in conjunction with a computer system, the computer-program product comprising a computer-readable storage medium and a computer-program mechanism embedded therein for configuring the computer system to reconstruct at least one output signal associated to a sequential logic circuitry block of a circuit, at least one input signal being associated to the circuitry block, the computer-program mechanism including:

instructions for simulating a value of the at least one output signal depending on the at least one input signal;

instructions for determining a transfer function for computing the value of the at least one output signal directly after a simulation timestamp depending on at least one of the at least one input signal and on the value of the at least one output signal directly before the simulation timestamp;

instructions for computing the value of the at least one output signal directly after the simulation timestamp as a function value of the transfer function if a reconstruction condition is fulfilled; and instructions for storing the simulated value of the at least one output signal directly after the simulation timestamp into a file if the reconstruction condition is not fulfilled.

14. The computer-program product of claim 13, wherein the reconstruction condition is fulfilled if computing the value of the at least one output signal directly after the simulation timestamp as the function value of the transfer function and simulating the value of the at least one output signal directly after the simulation timestamp yield the same result.

15. A computer system comprising at least one processor, a memory and a program module, wherein the program module is stored in the memory and configured to be executed by the at least one processor to reconstruct at least one output signal associated to a sequential logic circuitry block of a circuit, at least one input signal being associated to the circuitry block, the program module including instructions for simulating a value of the at least one output signal depending on the input signal;

instructions for determining a transfer function for computing the value of the at least one output signal directly after a simulation timestamp depending on the at least one input signal and/or on the value of the at least one output signal directly before the simulation timestamp; and instructions for computing the value of the at least one output signal directly after the simulation timestamp as a function value of the transfer function if a reconstruction condition is fulfilled.

16. The computer system of claim 15, the program module further comprising instructions for storing the simulated value of the at least one output signal directly after the simulation timestamp into a file if the reconstruction condition is not fulfilled.

17. The computer system of claim 16, wherein the reconstruction condition is fulfilled if computing the value of the at least one output signal directly after the simulation timestamp as the function value of the transfer function and simulating the value of the at least one output signal directly after the simulation timestamp yield the same result.

* * * * *